United States Patent [19]
Kuegler et al.

[11] Patent Number: 5,266,951
[45] Date of Patent: Nov. 30, 1993

[54] ANALOG TO DIGITAL CONVERTER CALIBRATION SYSTEM AND METHOD OF OPERATION

[75] Inventors: Lisa F. Kuegler, Tewksbury; Richard W. Burrier, Groton; Steven G. Labitt, Medford, all of Mass.

[73] Assignee: Raytheon Company, Lexington, Mass.

[21] Appl. No.: 815,713

[22] Filed: Dec. 30, 1991

[51] Int. Cl.$^5$ .............................................. H03M 1/10
[52] U.S. Cl. ..................................... 341/120; 341/118
[58] Field of Search ............................. 341/118, 120

[56] References Cited

U.S. PATENT DOCUMENTS

| | | | |
|---|---|---|---|
| 4,364,027 | 12/1982 | Marooka | 341/120 |
| 4,612,533 | 9/1986 | Evans | 341/120 |
| 4,862,168 | 8/1989 | Beard | 341/140 |
| 4,908,621 | 3/1990 | Polonio et al. | 341/120 |
| 4,947,168 | 8/1990 | Myers | 341/120 |
| 4,973,974 | 11/1990 | Suzuki | 341/118 |
| 5,047,772 | 9/1991 | Ribner | 341/156 |

OTHER PUBLICATIONS

A Phase-Plane Approach to the Compensation of High-Speed Analog-to-Digital Converters, T. A. Rebold & F. H. Irons, IEEE Circuits & Systems, 1987, pp. 455-458.

Comparison of State-of-the-Art Analog-to-Digital Converters, N. W. Spencer, Mar. 4, 1988, Project Report AST-4.

Primary Examiner—Marc S. Hoff
Attorney, Agent, or Firm—Donald F. Mofford; Richard M. Sharkansky

[57] ABSTRACT

A calibration circuit includes a plurality of signal sources each of said signal sources having an output port and providing a signal having a known phase and a signal combiner circuit having a plurality of input ports and an output port with each of said input ports being coupled to a corresponding one of said signal source output ports. The calibration circuit further includes a switch having a common port and at least one branch port, said branch port being coupled to said output port of said signal combiner circuit and an analog to digital converter circuit having an input port coupled to the common port and an output port. The calibration circuit further includes a central processing unit coupled to the output port of said analog to digital converter and a summing circuit having a first input port coupled to said central processing unit, a second input port coupled to the output port of said analog to digital converter circuit and an output port.

12 Claims, 8 Drawing Sheets

ANALOG TO DIGITAL CONVERTER CALIBRATION SYSTEM AND METHOD OF OPERATION

BACKGROUND OF THE INVENTION

This invention relates to calibration techniques and more particularly to calibration techniques for analog to digital converter circuits.

As is known in the art, radar and communication systems generally include analog receivers which receive an input RF signal, filters and possibly time-gates said signal and downconverts the signal to a lower frequency signal generally referred to as an intermediate frequency (IF) signal. One characteristic of a receiver is its dynamic range which can be described as the difference between the maximum and the minimum signal levels to which the receiver can provide a linear response.

Many radar and communication systems also include advanced digital signal processors. It is generally desirable to convert the analog signals to a digitized representation of said analog signals at as high a frequency as possible with given analog to digital converter techniques. Such digitized signals are fed to the digital signal processor. Thus, the analog receiver provides analog signals having a wide dynamic range directly to an analog to digital converter circuit (hereinafter ADC).

The ADC is fed the analog signals and provides, in response thereto, a digitized output signal. Ideally the digitized output signal provides an accurate representation of the analog input signal. In practice, however, the digitized signals from the ADC do not accurately represent the analog signal.

That is, the ADC typically has a dynamic range which is less than the dynamic range of the receiver and, consequently, the analog signals fed thereto. When fed analog input signals having a large amplitude for example, the ADC provides a digitized output signal having harmonic distortion. That is, the ADC fails to provide a linear response to signals fed thereto. Furthermore, because the ADC provides a discrete voltage level for a continuous range of analog voltage levels fed thereto, there exists a so-called quantization error which may be defined as the difference between the analog value and its quantized representation. These are sources of error in radar and communication systems. Thus the ADC limits the performance of radar and communication systems.

Nevertheless, the digitized output signal is fed to a digital signal processor as is generally known. Thus the ADC receives analog signals and subsequently provides digitized output signals to other portions of the radar system or communication system.

However, in many applications such digital signals are often distorted. The quantization error in the ADC may be reduced by providing an ADC having a large number of bits. This technique, however, fails to reduce errors due to harmonic distortion. It is known in the art that calibration techniques can be used to provide ADCs having a linear response to analog signals fed thereto and thus reduce the harmonic distortion of the ADC.

One paper entitled "A Phase Plane Approach to the Compensation of High-Speed Analog-to-Digital Converters" by T. A. Rebold and F. H. Irons published in the 1987 IEEE International Symposium on Circuits and Systems describes a technique to calibrate an ADC. In this technique, a signal source sequentially provides a plurality of sinusoidal calibration signals (i.e. a sinewave signal) to the input port of an analog receiver. An ADC is coupled to the output port of the analog receiver. Each one of the plurality of calibration signals should have a frequency which is synchronous of a submultiple of the ADC sample rate. The signal source provides the calibration signals having frequencies corresponding to the maximum frequency in the application band and having distortion sidebands which are lower than the maximum allowable system specification. The ADC receives the sinusoidal calibration signal from the analog receiver and provides a distorted digitized calibration sinewave at its output terminal.

During the calibration, a compensation processor (e.g. the CPU of a digital computer) provides a reference sinewave and subtracts the distorted sinewave from the reference sinewave. That is, the compensation processor subtracts each digitized signal provided at the output port of the ADC from a corresponding point of the reference signal. The amplitude and time delay of either the distorted or the reference sinewave are adjusted to minimize the difference between the two signals. The compensation processor also computes the slope of the distorted sinewave at desired time intervals.

Noise, generally referred to as dither noise, having a voltage level corresponding to the quantization noise power of the ADC is added to the distorted sinewave to randomize the quantization error of the ADC. The measurement is therefore performed several times to statistically average the results and thus remove the random errors induced onto the calibration sinewave by the so-called dither noise.

The compensation processor computes the value of the average error between the distorted and reference sinewaves. The compensation processor then stores the average error value as a compensation value in a compensation memory (e.g. a random access memory or RAM). In the above technique, the amplitude and the change in amplitude with respect to time (i.e. the slope) of the output signal at the output port of the ADC are used to provide the addresses to the memory location in which a compensation value is stored. That is, the amplitude and slope taken together correspond to an address location of the compensation memory. The compensation value corresponding to the particular amplitude and slope values is thus stored in the corresponding memory location. Thus the compensation processor provides compensation values to the compensation memory by measuring the difference between the digitized calibration signal and the reference signal at the output port of the ADC.

In this calibration approach each sinewave provides relatively few compensation values to the compensation memory. Thus, many sinewaves having different amplitudes and frequencies are required to provide each memory location of the compensation memory with a compensation value. When the receiver is operated in the receive mode, the ADC provides at its output port digitized output signals having errors. The amplitudes and the slopes of the digitized output signals correspond to addresses of memory locations in the compensation memory. The compensation value stored in the memory location of the compensation memory is provided to the output port of the ADC. The compensation value is added to the digitized output signal having errors. The compensation value thus compensates the errors of the digitized output signals.

This calibration technique provides compensation for errors resulting from both integral non-linearity such as third order distortion as well as differential non-linearity such as errors in ADC quantization levels. Furthermore, distortion related to the input signal slew rate can be corrected.

However, one problem with the conventional calibration approach is that it provides an improvement in the dynamic range of the ADC only for analog signals having a frequency at the frequency of the calibration signal. Thus, it would be desirable to provide a technique which improves the dynamic range of the ADC for signals having frequencies other than the calibration signal frequencies.

A second problem with the conventional approach is that it requires a large amount of time to provide the compensation memory with an adequate number of compensation values. This is because each single sinewave calibration signal provides the compensation memory with relatively few compensation values. Thus many single sinewave calibration signals each having a different amplitude and or frequency are required to provide the compensation memory with an adequate number of compensation values.

Many applications, particularly radar system and communication system applications, must operate on a real time basis. Thus it is desirable to minimize the amount of calibration time.

The amount of time required to fill the compensation memory may be reduced by thinning, that is, by providing the compensation memory having fewer compensation values. The compensation processor could then interpolate between compensation values to provide estimates of the missing compensation values. However, thinning is applicable only if the compensation values in the compensation memory are relatively predictable in that region of the compensation memory having relatively few compensation values. Thus, it would be desirable to provide the compensation memory having a uniform distribution of compensation values to minimize the amount of thinning and interpolation.

SUMMARY OF THE INVENTION

In accordance with the present invention a calibration circuit includes a plurality of signal sources, each of the signal sources having an output port providing an analog signal having a known phase, a signal combiner circuit having a plurality of input ports and an output port with each of the input ports being coupled to a corresponding one of the signal source output ports and a switch having a common port and at least one branch port with the branch port being coupled to the output port of the signal combiner circuit. The calibration circuit further includes an analog to digital converter circuit having an input port coupled to the switch common port and an output port coupled to a central processing unit and a summing circuit having a first input port coupled to the central processing unit, a second input port coupled to the output port of the analog to digital converter circuit and an output port. The central processing unit (CPU) provides a reference signal represented by a second stream of digital words corresponding to a substantially error free representation of the first stream of digital words provided from the ADC. The CPU computes the difference between the first and second stream of digital words and stores the difference signal as a compensation value in a particular memory location of a memory. The address of the particular memory location corresponds to an amplitude value and a slope value of the first stream of digital words. With this particular arrangement a circuit to calibrate an A/D converter is provided. The ADC receives the plurality of analog signals having a known phase and converts such signals to a first stream of digital words representative of the plurality of analog signals. By simultaneously providing the plurality of analog signals to the ADC a large number of different compensation values may be provided to the memory in a relatively short period of time. Thus a high speed calibration technique is provided. Furthermore, if an analog receiver is disposed between the common port of the switch and the input port of the ADC the compensation values compensate for errors in the analog receiver. Moreover by providing a plurality of analog signals to the input port of the ADC the ADC is able to compensate signals over a relatively broad range of frequencies. Further, the calibration circuit increases the dynamic range of the ADC.

In accordance with a further aspect of the present invention, a method of calibrating an analog to digital converter circuit includes the steps of simultaneously feeding a plurality of analog signals to an input port of an analog to digital converter circuit, converting the analog signals to a first stream of digital words representative of the plurality of analog signals and coupling the first stream of digital words from an output port of the analog to digital converter circuit to an input port of a computing means. The method further includes the steps of providing a second stream of digital words corresponding to a reference signal representative of a relatively error free representation of the plurality of analog signals to the central processing unit and computing the difference between the first stream of digital words and a corresponding portion of the second stream of digital words to provide a third stream of digital words corresponding to a difference signal. With this particular technique a method of calibrating an analog to digital converter circuit (ADC) via a memory having a uniform distribution of compensation values stored therein is provided. The plurality of analog signals may be provided as a pair of sinusoidal signals which in a spectral representation thereof have the appearance of a double side band suppressed carrier signal. A pair of sinusoidal signals provides the memory having a relatively high number of compensation values when compared to the number of compensation values provided by a conventional single sinusoidal signal. Furthermore, the pair of sinusoidal signals provides a more uniform distribution of compensation values in the memory than the conventional single sinusoidal signal. Moreover, a compensation memory having many compensation values uniformly distributed throughout is desirable since the compensation values in a particular portion of the compensation memory tend to have relatively predictable variations. Thus it is relatively easy to interpolate between two compensation values to provide a relatively accurate compensation value. Further, the pair of analog signals minimizes the amount of time needed to provide the memory having a high number of compensation values uniformly distributed therein. Thus, a high speed calibration technique is provided.

BRIEF DESCRIPTION OF THE DRAWINGS

The foregoing features of the invention as well as the invention itself may be more fully understood from the following detailed description of the drawings in which.

DESCRIPTION OF THE PREFERRED EMBODIMENT

Figure 1:
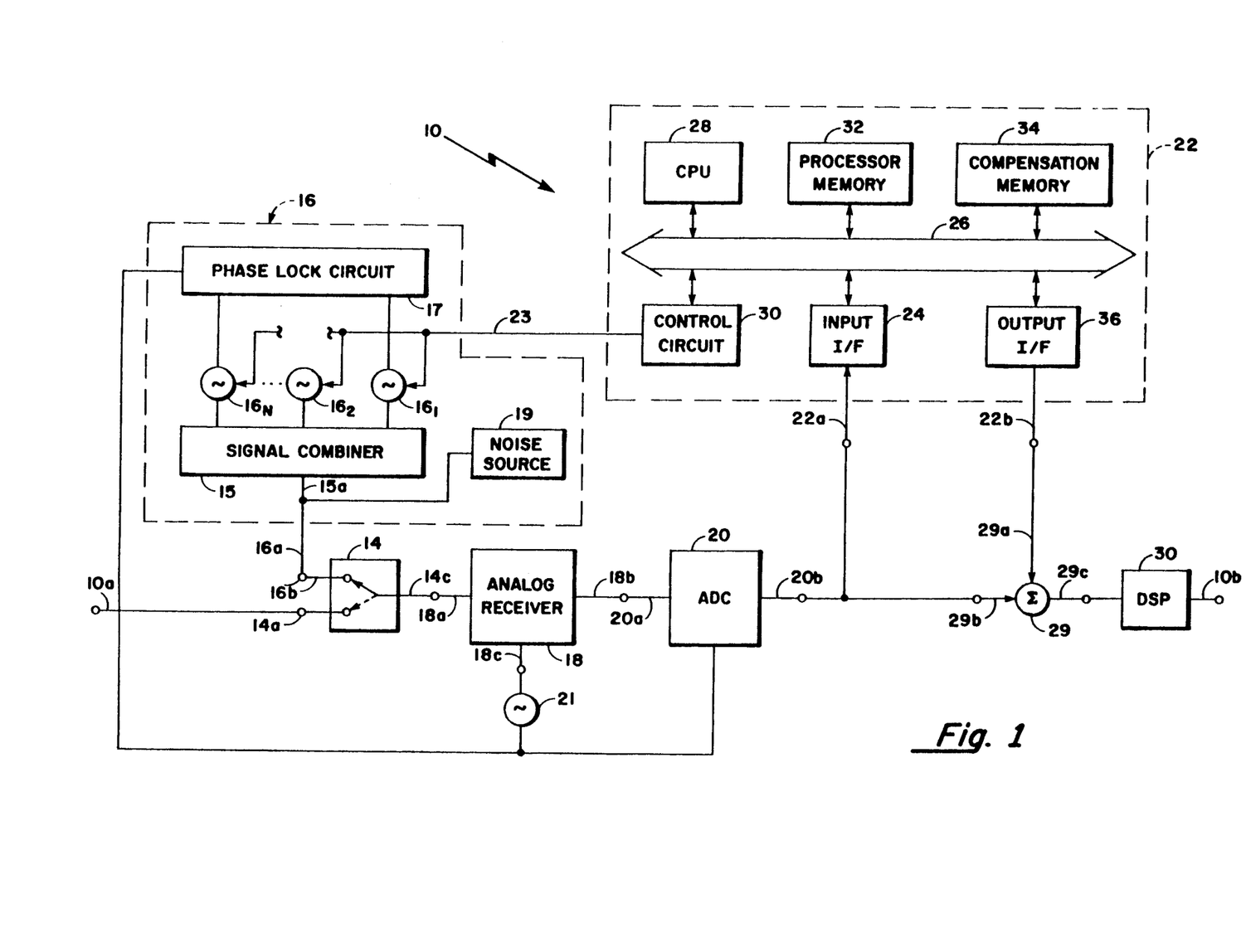
FIG. 1 is a block diagram of a RF receiving system having an analog to digital converter and calibration circuit in accordance with the present invention.

Referring now to FIG. 1, a receiving system 10 having an input port 10a and an output port 10b includes a first switch 14 having a first branch port 14a coupled to the input terminal 10a. A second branch port 14b is coupled to a calibration source 16. The calibration source 16 here includes N signal sources $16_1$-$16_N$ with each signal source phase locked together via a phase lock circuit 17. Each of the N signal sources $16_1$-$16_N$ provides a signal having a predetermined frequency and a predetermined signal level.

The particular selection of such signals from the calibration source 16 will be described further below and in conjunction with FIGS. 2A, 2B. Suffice it here to say that either one or a plurality of the signal sources $16_1$-$16_N$ may provide a signal to a signal combiner 15. The signal combiner 15 combines signals fed thereto and provides such combined signals to an output port 15a. A noise source 19 provides a noise signal, generally referred to as dither noise, having a voltage level corresponding to the quantization noise power of the ADC to the output port 15a of the signal combiner 15. Thus noise is added to the combined signals provided from the signal combiner 15.

The signal combiner output port 15a is coupled to the branch port 14b of the switch circuit 14. Thus the calibration source 16 provides at the output port 16a, a composite calibration signal (hereinafter calibration signal) to the branch port 14b of the switch 14.

A common port 14c of the switch 14 is coupled to an input port 18a of an analog receiver 18. The receiver 18 includes at least one nonlinear element, such as a mixer (not shown) for example. The receiver 18 is fed a signal from the switch 14, as well as a so-called local oscillator (LO) signal at a terminal 18c from a LO signal source 21. The receiver 18 provides a downconverted analog signal at an output port 18b as is generally known. The output port 18b of the receiver 18 is coupled to an input port 20a of an analog to digital converter circuit 20 (hereinafter ADC). Thus, the receiver 18 provides analog signals to the ADC 20.

The phase lock circuit 17 is coupled to the LO signal source 21 and the ADC 20 as shown to provide synchronous timing between the signal sources $16_1$-$16_N$, the LO signal source 21 and the ADC 20.

The ADC 20 receives the analog signals fed to the input port 20a and provides a stream of digital signals corresponding to said analog signal at the output port 20b. The output port 20b of the ADC 20 is coupled to an input terminal 22a of a compensation processor 22.

The compensation processor 22 includes an input interface circuit 24 (hereinafter input I/F), a bi-directional data bus 26, a central processing unit 28 (hereinafter CPU), a control circuit 30, a processor memory 32, a compensation memory 34, and an output interface circuit 36 (hereinafter output I/F). The operation of the compensation processor 22 will be further discussed in conjunction with FIGS. 2-2C. Suffice it here to say, the control circuit 30 provides a control signal to each of the N signal sources $16_1$-$16_N$ via a control line 23. The control circuit 30 provides the control signals to selectively turn on and off each of the N signal sources $16_1$-$16_N$. Thus predetermined ones of the signal sources $16_1$-$16_N$ provide signals to the signal combiner 15. The compensation processor 22 receives the stream of digital signals from the ADC 20 via the input I/F 24 and provides the signals to the CPU 28 via the data bus 26. The CPU 28 performs certain processing steps as will be described in conjunction with FIGS. 2-2C and provides compensation values to the compensation memory 34. The compensation memory 34 may be provided for example as a random access memory (RAM).

Those of skill in the art will recognize that the CPU 28, the compensation memory 34, and the control circuit 30 may be provided as separate circuit components electrically coupled by cables or other data transmission media. Alternatively, CPU 28, compensation memory 34, and control circuit 30 may be physically integrated to provide the compensation processor 22. Furthermore, other digital computer architectures may be used to provide the compensation processor 22.

The compensation memory 34 provides compensation values to a summing circuit 29 at a first input port 29a. A second input port 29b of the summing circuit 29 is coupled to the output port 20b of the ADC 20. The summing circuit 29 receives signals fed to the input ports 29a, 29b and provides an output signal at an output port 29c. The output signal corresponds to the sum of the two input signals. The output port 29c of the summing circuit 29 may be coupled to a digital signal processor 30, for example, as is generally known.

The receiving system 10 operates in either a calibration mode or a receiving mode. For example, to place the receiving system 10 in the calibration mode, the switch circuit 14 provides a connection between the common port 14c and the branch port 14b which provides a signal path between the calibration source 16 and the analog receiver 18.

In the calibration mode, the calibration source 16 provides a calibration signal as an input signal to the receiver 18 via the switch 14. The receiver 18 provides in response to the calibration signal a frequency translated (e.g. a downconverted) calibration signal at the output port 18b. The receiver 18 provides the frequency translated calibration signal having a predetermined frequency. The maximum voltage level of the calibration signal provided at the output port 18b of the receiver 18 should correspond to the maximum acceptable input voltage level (hereinafter full scale voltage level) at the input port 20a of the ADC 20.

Figure 2:
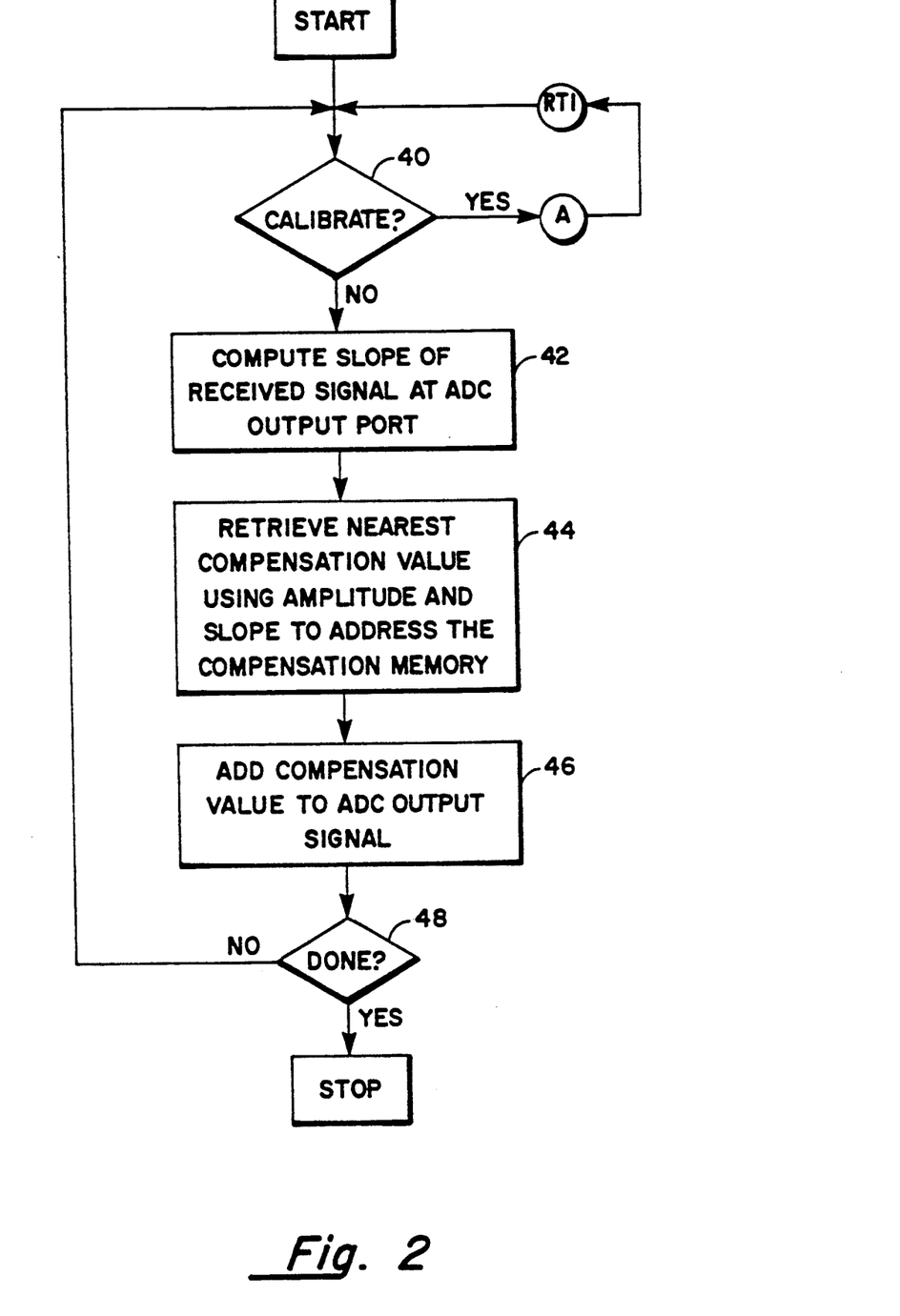
FIG. 2 is a flow chart illustrating steps performed in compensating a digital signal provided from the A/D converter circuit of FIG. 1.
Figure 2A:
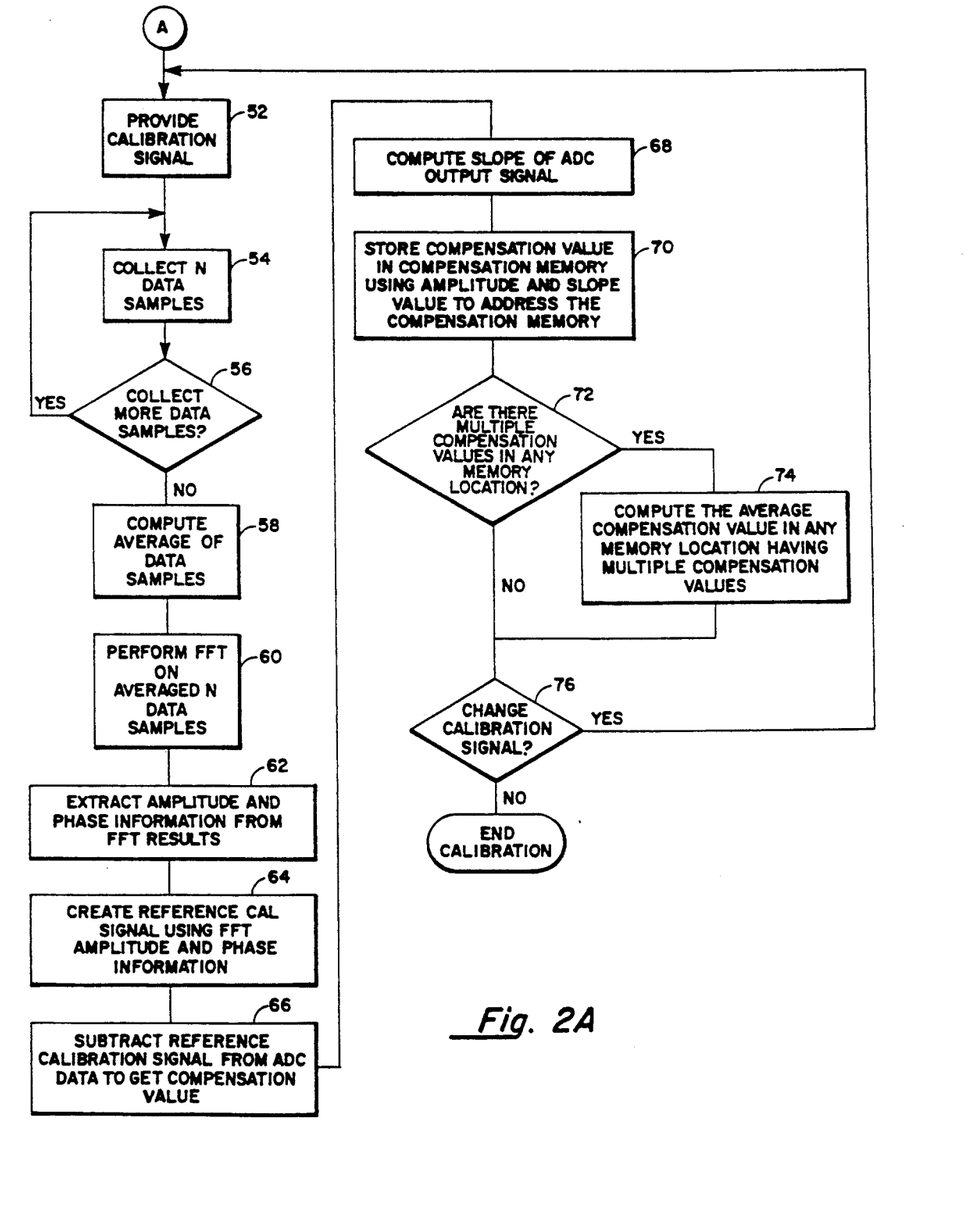
FIGS. 2A and 2B are flow charts illustrating steps performed in providing compensation values for the calibration circuit of FIG. 1 to compensate for errors introduced by the A/D converter of FIG. 1.
Figure 2B:
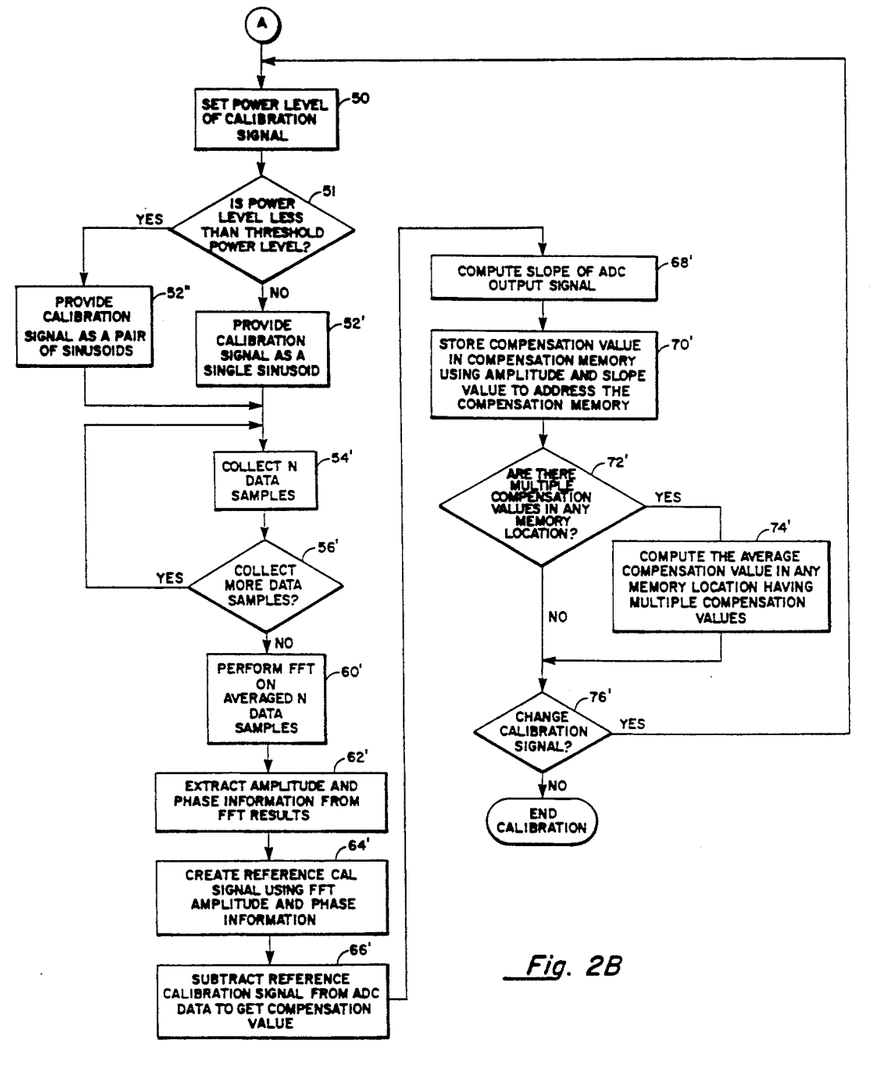

As will be further discussed in conjunction with FIGS. 2A, 2B, the calibration source 16 in the present invention provides the calibration signal having a pair or alternatively a plurality of pairs of substantially pure sinusoidal signals. In a spectral representation, such a pair of sinusoidal signals has the appearance of a double side band suppressed carrier signal (i.e. a pair of spectral lines each at a particular frequency). Suffice it here to say that when the voltage level of the two sinusoidal signals are added in phase at the input port 20a of the ADC 20 the resultant voltage level should substantially correspond to the so-called full scale voltage level of the ADC 20.

The ADC 20 receives the analog calibration signal at the input port 20a and provides at the output port 20b a digitized calibration signal. Practical analog to digital converter circuits, however, provide a digital representation of such analog signals which includes distortion.

As will also be further discussed in conjunction with FIGS. 2A, 2B, the compensation processor 22 computes compensation values to compensate for the distortion in such digital signals. Suffice it here to say that the compensation processor 22 provides a reference signal corresponding to an ideal calibration signal (i.e. a calibration signal having no distortion) and measures the difference between the digital representation of the calibration signal including the distortion and the reference signal.

The compensation processor 22 subtracts the digital representation of the calibration signal from the reference signal to provide a compensation value. Prior to the subtraction, the erred calibration signal and the reference signal are aligned in time to minimize errors in the difference signal caused when the erred calibration and the reference signals are misaligned. The compensation processor 22 provides the difference signal to the compensation memory 34 as a compensation value.

The CPU 28 stores the compensation value in a particular storage location of the compensation memory 34. Each particular location is identified by two particular values generally referred to as indices. The first index corresponds to the voltage amplitude of the digitized signal provided by the ADC 20 at a particular sample point. The second index corresponds to the slope of the digitized signal at the particular sample point. The compensation processor may use any well known technique to compute the slope of the digitized signal as will be discussed in conjunction with FIG. 2.

To place the receiving system 10 in the receive mode, the switch circuit 14 provides a connection between the common port 14c and the branch port 14a. In the receive mode, signals fed to the input port 10a of the receiving system 10 are coupled to the branch port 14a of the switch 14. Such signals are subsequently fed to the common port 14c of the switch. The analog receiver 18 receives the input signals from the common port 14c of the switch 14 and provides a downconverted analog signal to the ADC 20.

The ADC 20 receives the analog signal fed to the input port 20a and provides a stream of digital signals corresponding to said analog signal at the output port 20b. The ADC 20 provides the digitized signal from the output port 20b to the compensation processor input port 22a and to the input port 29b of the summing circuit 29.

As will be described further in conjunction with FIG. 2, in the receive mode the CPU 28 performs the processing necessary to compute the amplitude and slope values (i.e. the indices) of the digitized signal fed thereto. The CPU 28 then provides said amplitude and slope values to the compensation memory 34.

As previously discussed, the amplitude and slope values provided from the CPU 28 identify a particular memory location of the compensation memory 34 In the ideal case, each memory location of the compensation memory 34 holds a compensation value.

The compensation memory 34 subsequently provides the compensation value corresponding to the amplitude/slope values fed thereto to the data bus 26. The compensation value is fed to the output I/F 36 along the data bus 26. The compensation value is fed from the output I/F 36 to the input port 29a the summing circuit 29.

The summing circuit 29 receives input signals fed to the input ports 29a, 29b and provides an output signal at the output port 29c. The output signal corresponds to the sum of the input signals fed to the input ports 29a, 29b.

Thus when the receiving system 10 operates in the receive mode, the digital representation of the received signal is fed from the ADC output port 20b to the input terminal 29a of the summing circuit 29. Likewise, the compensation processor 22 feeds a compensation value to the input terminal 29b of the summing circuit 29. The summing circuit 29 receives the signals fed thereto and provides a digital output signal at the output port 29c. The digital output signal provided at the output terminal 29c therefore corresponds to a compensated digital output signal.

In the ideal case, the compensation value compensates for distortion or errors in the digital input signal. Therefore the digital signal provided at the output port 29c of the summing circuit 29 corresponds to a substantially error free version of the digital signal fed to the input port 29b.

The compensated digital signal is subsequently fed from the output port 29c of the summing circuit 29 to a digital signal processor 30, for example, as is generally known.

Referring now to FIGS. 2, 2A, 2B, a series of flow diagrams which summarize a sequence of instructions controlling the operation of the compensation processor 22 (FIG. 1) are shown.

The rectangular elements (typified by element 42, FIG. 2) herein denoted "processing blocks," represent computer software instructions or groups of instructions. The diamond shaped elements (typified by element 40, FIG. 2) herein denoted "decision blocks," represent computer software instructions or groups of instructions which effect the execution of the computer software instructions represented by the processing blocks. The flow diagrams of FIGS. 2, 2A, 2B do not depict syntax of any particular computer programming language. Rather, each of the flow diagrams illustrate the functional information one skilled in the art requires to generate computer software to perform the processing required of the compensation processor 22. It should be noted that many routine program elements such as initialization of loops and variables and use of temporary variables are not shown.

Referring first to FIG. 2, the "main routine" for the compensation processor 22 includes a decision block 40. The decision block 40 selects either the receive or the calibration mode of operation for the compensation processor 22 (FIG. 1). Such a decision may be made according to one or all of a variety of factors provided to the compensation processor 22 (FIG. 1). These factors may include but are not limited to a fixed time interval or external data for example. The basis for such a decision will not here be discussed. Suffice it here to say that if the compensation processor 22 (FIG. 1) operates in the calibration mode, the compensation processor 22 (FIG. 1) performs a "calibration routine" having a program flow described in conjunction with the flow diagrams of FIGS. 2A, 2B.

If, however, the compensation processor 22 (FIG. 1) operates in the receive mode, processing block 42 determines the amplitude and slope values of a digital signal fed to the compensation processor 22 (FIG. 1) from the ADC 20 (FIG. 1).

Those of skill in the art will recognize the slope of the digital signal may be computed in a variety of ways. For example, as is known, a second ADC (not shown) may be disposed in parallel with the ADC 20 (FIG. 1) to compute the slope of signals fed to ADC 20. Alternatively, the compensation processor may compute the slope of digital signals using any well known technique such as the so-called "state space" technique or the central difference equation provided in Eq. 1:

$$\dot{V}_k = (V_{k+1} - V_{k-1})/2T \qquad \text{Eq. 1}$$

In Eq. 1, the term $\dot{V}_k$ corresponds to the estimate of the slope of the digitized signal at sample time k. The term $V_{K+1}$ corresponds to the voltage of the digitized signal in units of volts at the time (k+1). The term $V_{K-1}$ corresponds to the voltage level of the digitized signal in units of volts at the sample time (k−1). The term T corresponds to the sample period $1/f_s$ where $f_s$ is the sampling frequency of the ADC 20 (FIG. 1). Of course, other methods to compute the slope of the digital signal may also be used.

The next step performed by the compensation processor 22 (FIG. 1) as depicted in processing block 44 includes retrieval of a compensation value from the compensation memory 34 (FIG. 1). The CPU 28 (FIG. 1) uses the amplitude and slope values to access a particular memory location in the compensation memory 34 (FIG. 1) having a desired compensation value. That is, taken together the amplitude and slope values identify a particular memory location in the compensation memory 34 (FIG. 1). If the particular memory location fails to contain a compensation value, the CPU 28 (FIG. 1) identifies the nearest memory location having a compensation value.

The nearest memory location having a compensation value may be selected, for example, based on the Pythagorean theorem. Other methods may also be used to select the nearest cell having a compensation value.

In processing block 46, compensation memory 34 provides the selected compensation value to the data bus 26 (FIG. 1). The compensation value is subsequently fed to the summing circuit input port 29a (FIG. 1) via the output I/F 36 (FIG. 1). As previously described in conjunction with FIG. 1, the summing circuit 29 (FIG. 1) subsequently adds the compensation value to a digital signal provided to the second input port 29b of the summing circuit 29.

Decision block 48 implements a loop which either returns the program flow to the starting point of the main routine or ends the main routine.

Referring now to FIG. 2A, a flow diagram shows the preferred processing performed in compensation processor 22 during the calibration mode to provide the compensation values stored in the compensation memory 34 (FIG. 1).

Processing block 52 provides a control signal on the control line 23 (FIG. 1) to provide a calibration signal from one or alternatively from a plurality of the signal sources $16_1$–$16_N$ (FIG. 1). In a preferred approach the calibration source 16 (FIG. 1) provides a pair of sinewave signals. Thus the calibration source 16 provides a first pair of sinewave signals with each signal of said pair of signals having a different frequency and having a predetermined voltage level. The selection of particular frequencies will be discussed further below.

The processing block 54 and decision block 56 implement a loop wherein the compensation processor 22 collects a predetermined number of data samples. That is, the CPU 28 first collects N data samples of the calibration signal from the ADC output port 20b. The CPU 28 then stores the N data samples in the processor memory 32 (FIG. 1). N additional data samples of the calibration signal may be collected to provide average values of the measured data. Each subsequent set of N data samples should be phase aligned by the CPU 28. That is the CPU performs processing steps necessary to phase align each set of N data samples. Thus the subsequent sets of N data samples are added to the existing N data samples which have been previously phase aligned by the CPU 28 and stored in the processor memory 32.

If a decision not to collect more data samples is made then, as shown in decision block 58, the CPU 28 computes the arithmetic average of the N data samples. For example, if N corresponds to 512 data points and the signal is sampled four times at each of the 512 data points, the average value of a single one of the 512 data points is provided by adding the four samples corresponding to the data point and dividing by four. Thus an average value of each data point may be provided.

This technique reduces the variance of the noise and provides the average value of four data samples taken along the calibration signal at different instances in time. Thus this process is generally referred to as time averaging the data.

In processing block 60 the CPU 28 performs a fast Fourier transform (FFT) on the averaged N data samples. The FFT converts the input data from a time domain representation of the signal to a frequency domain representation of the signal.

In processing block 62 the CPU 28 extracts the amplitude and phase information from the results of the FFT.

It should here be noted that calibration source 16 (FIG. 1) provides the pair of signals having frequencies separated by either an odd or an even number of FFT frequency bins. For example, if the ADC 20 is provided having a 10 megahertz (MHz) sample rate and the processor memory 32 holds 512 data points then the frequency bandwidth of one so-called FFT frequency bin corresponds to 19.53125 kilohertz (KHz) (i.e. 10 MHz/512). Thus the size of each frequency bin is dependent on the number of data points used to perform the fast Fourier transform.

Letting $F_1$ correspond to the frequency of the first sinewave signal and $F_2$ correspond to the frequency of the second sinewave signal and BW correspond to the frequency bandwidth of one FFT frequency bin, the frequency separation (S) of the two sinewave signals may be determined according to the formula:

$$S = \frac{F_2 - F_1}{BW}$$

If S corresponds to an even integer then the signals are separated by an even number of FFT frequency bins. Likewise S corresponding to an odd integer indicates an odd number of FFT frequency bins separates the two signals having the frequencies F1, F2. The frequency of each of the two sinewave signals should of course be within the range of frequencies accepted by the ADC 20 (FIG. 1). Empirical results have shown that signals having frequencies separated by an odd number of FFT frequency bins provide a more uniform distribution of compensation values in the compensation memory 34 (FIG. 1) than signals having frequencies separated by an even number of FFT frequency bins. Thus it is desirable to provide the two signals having frequencies separated by an odd number of FFT frequency bins.

Processing block 64 provides a reference calibration signal. Here, the amplitude and phase data extracted from the FFT provide mathematical constants used to provide the reference calibration signal. For example, two sinewave signals may be described mathematically by Equation 2:

$$S(t) = A_1 \sin(w_1 t + \phi_1) + A_2 \sin(w_2 t + \phi_2) \qquad \text{Eq. 2}$$

in which $A_1$, $A_2$ correspond to the amplitudes of the two sinewave signals; $w_1$, $w_2$ correspond to the radian frequencies of the two sinewave signals; $\phi_1$, $\phi_2$ correspond to phase terms of the sinewave signals; and t corresponds to a time variable. The FFT thus provides values for $A_1$, $A_2$, $\phi_1$ and $\phi_2$. Thus the CPU 28 may use Equation 2, for example, to provide the reference signal for a pair of analog sinewave signals.

As shown in processing block 66, the CPU 28 (FIG. 1) subtracts the digitized calibration signal from the reference calibration signal. The difference between the two signals corresponds to a compensation value.

Processing block 68 computes the slope of the digitized signal provided from the ADC 20 using any technique well known to those of skill in the art such as the central difference equation, for example as previously described in conjunction with processing block 42 (FIG. 2).

Processing block 70 stores the compensation value in the compensation memory 34 using the amplitude and slope values of the ADC output signal to provide an address location in the compensation memory 34.

In decision block 72, the CPU 28 (FIG. 1) checks to see if the memory location addressed by the current amplitude and slope information already contains a compensation value. If the memory location already contains a compensation value the two values are mathematically averaged and the average value is stored in the memory location of the compensation memory 34 (FIG. 1) as shown in processing block 74.

A decision is then made, as depicted in decision block 76 as to whether a new calibration signal should be provided. This decision may be based on a variety of factors including but not limited to the amount of available calibration time, or the percentage of memory locations in the compensation memory 28 (FIG. 1) having a compensation value stored therein, for example. If a decision is made to provide another calibration signal then the processing begins again at processing block 52. If decision is made to not provide another calibration signal then control is transferred from the calibration routine back to the main routine.

Thus, the flow diagram of FIG. 2A shows processing performed in compensation processor 22 (FIG. 1) to provide a first pair of sinewave signals having a first pair of frequencies and preferably a second pair of sinewave signals having a second different pair of frequencies to provide compensation values in the compensation memory 34. The first pair of sinewaves may have frequencies separated by an odd number of frequency bins for example. Similarly, the second pair of signals may have frequencies preferable separated by a different odd number of frequency bins. The maximum voltage amplitude of each pair of sinewave signals when added in phase should correspond to the maximum allowable input voltage of the ADC.

A compensation memory having many compensation values uniformly distributed throughout is desirable since the compensation values in a particular portion of the compensation memory tend to have relatively predictable variations. Thus it is relatively easy to interpolate between two compensation values to provide a third relatively accurate compensation value.

A compensation memory having many compensation values uniformly distributed throughout results when the calibration signal comprises a pair of substantially pure sinusoidal signals having frequencies separated by an odd number of FFT frequency bins. The distribution of compensation values in the compensation memory provided from a pair of sinusoidal signals having frequencies separated by an even number of frequency bins results in redundant data (i.e. multiple compensation values in a particular memory location) and thus provides the compensation memory having fewer memory locations having compensation values stored therein.

We have conducted tests using the calibration technique of the present invention described in FIG. 2A on a AD9005 12 bit analog to digital converter circuit manufactured by Analog Devices Corporation located in Norwood, MA having a sampling rate of 10 megasamples/sec. The calibration technique was implemented using a 512 point fast Fourier transform. As can be seen by comparing the uncompensated frequency spectrum of FIG. 4A with the compensated frequency spectrum of FIG. 4B and as will be described further in conjunction with FIGS. 4A-4C, this technique provides a dynamic range increase of 13 dB over a 0.5 megahertz bandwidth for a pair of signals.

Furthermore, to provide a compensation value for each state of a twelve bit analog-to-digital converter would require typically about 16 million compensation values (i.e. $2^{12}$ amplitudes and $2^{12}$ slopes) and a memory location corresponding to each compensation value. To provide each memory location with a compensation value using the conventional calibration technique would require about 2,048 sinusoidal signals having different amplitudes and four tests for each amplitude to average the data resulting in a total of 8,192 tests. At 0.1 seconds per test to allow for switching and settling time for the calibration signal would thus require 13.6 minutes to provide each memory location with a compensation value.

We have conducted tests using the calibration technique of the current invention and using a twelve-bit analog-to-digital converter and we have found that this technique provides reasonable results if the compensation memory is provided having 1024 compensation values. To provide 1024 compensation values requires two calibration signals having sinusoidal signals and four tests per calibration signal resulting in a total of 8 tests. At 0.1 seconds per test the calibration technique of the present invention would require 0.8 seconds to provide the 1024 compensation values.

Referring now to FIG. 2B, a flow diagram shows an alternate series of processing steps which may be performed in the compensation processor 22 during the calibration mode to provide compensation values to the compensation memory 34.

Processing block 50 sets the power level of the signal sources which provide the calibration source. After the power level is set, decision block 51 checks to see if the power level is below a predetermined threshold power level. The selection of the threshold power level will be described further below. Suffice it here to say that if the power level is greater than the threshold power level, the calibration source provides the calibration signal as a single sinusoidal signal as shown in processing block 52'. However, if the power level is lower than the threshold power level the calibration source provides the calibration signal as a pair of sinusoidal signals as shown in processing block 52".

The loop implemented by processing block 54' and decision block 56' performs the same function as processing block 54 and decision block 56 described in conjunction with FIG. 2A. In the flow diagram of FIG. 2B note that processing block 58 (FIG. 2A) has been omitted although it may optionally be included. The remaining processing which takes place in the flow diagram of FIG. 2B and described in blocks 60'-76' is the same as that described in conjunction with FIG. 2A and described in blocks 60-76 (FIG. 2A).

We have used the approach of FIG. 2B to provide compensation values to the compensation memory by performing a single sinewave test starting at 0 decibels below full scale signal level of the ADC (0 dBfs) and then decrementing reaching a power level corresponding to 6 dB below the so-called full scale signal level (−6 dBfs). At each power level the compensation processor collects N data points. From these data points a reference sinewave is computed. The compensation processor measures the difference between corresponding data points of the reference sinewave and the sinewave and stores a difference signal in the compensation memory as a compensation value.

Figure 3A:
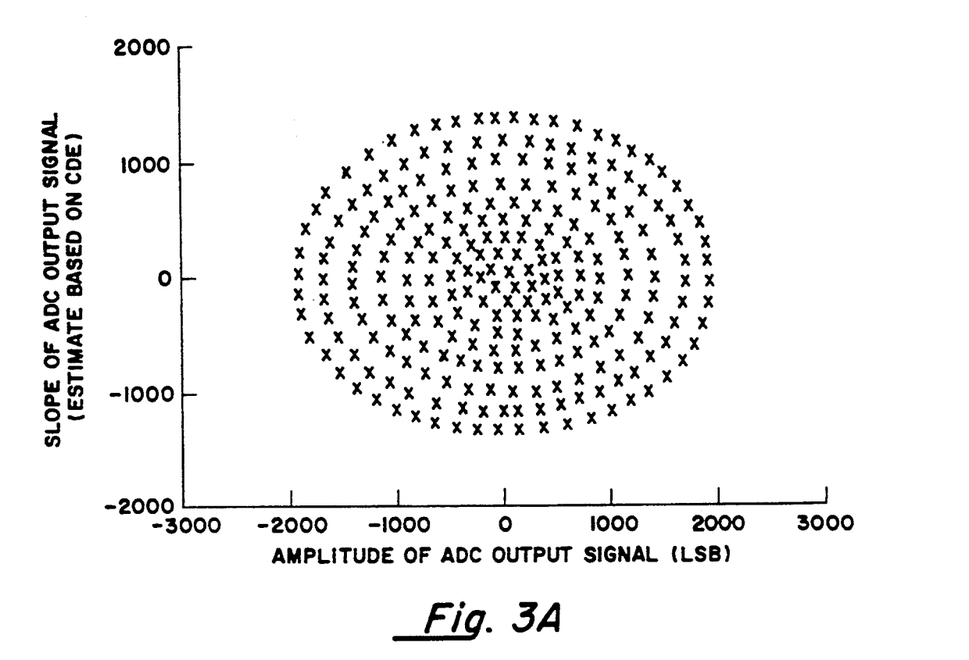
FIGS. 3A-3C are plots of slope of an A/D converter output signal versus amplitude of A/D converter output signal representing a plane of compensation values for the A/D converter of FIG. 1.

Referring momentarily to FIG. 3A the memory locations of the compensation memory have been mapped to a provide an X-Y plot of the location of compensation values stored in the compensation memory. The amplitude of the ADC output signal in units of least significant bits (LSBs) of the ADC is plotted along the X-axis while the slope of the ADC output signal as calculated via the central difference equation is plotted along the Y-axis.

As shown in FIG. 3A when the memory locations of the compensation memory are mapped to provide an x-y plot the compensation values provided from large signal levels fed to the ADC from elliptical contours in the x-y plot of the compensation memory. FIG. 3A shows the location of compensation values in the compensation memory provided using the conventional approach (i.e. a single sinusoidal calibration signal). Note that the compensation values form elliptical contours in the x-y plot of the compensation memory. The non-linear response of the ADC provides a deviation between the ellipse provided by measured compensation values and the ellipse provided by theoretical compensation values (not shown).

Referring again to FIG. 2B, those compensation values provided in the compensation memory which are addressed by calibration signals having small amplitude and slope values have amplitudes which vary by less than one LSB of the ADC. Furthermore, the amplitudes of the compensation values vary in a somewhat smooth manner. Thus it is relatively easy to interpolate between such compensation values and the calibration signal for small signal conditions need not require the large number of tests which are required by the conventional single sinewave calibration approach.

Calibration signals having large amplitudes provide compensation values having amplitude variations greater than one least significant bit (LSB) and having elliptical contours in the x-y plot of the compensation memory which are not clearly defined. Thus for those signals having large amplitudes, the single sinewave test is appropriate to provide the most uniform occupancy possible.

Using an amplitude variation of the compensation values corresponding to one LSB as a criterion for providing a calibration signal comprised of a single sinusoidal signal rather than a calibration signal comprised of a pair of sinusoidal signals suggests that the single sinewave calibration signal is required for calibration signals having an amplitude in the range of 0 dBfs (dB full scale) to −6 dBfs while for calibration signals having an amplitude less than −6 dBfs a calibration signal comprised of a pair of sinusoidal signals may be used. That is, the threshold power level here corresponds to −6 dBfs. The application of this concept, of course, is dependent upon the non-linearities of the particular ADC circuit and a different threshold power level may of course be used.

Figure 3B:
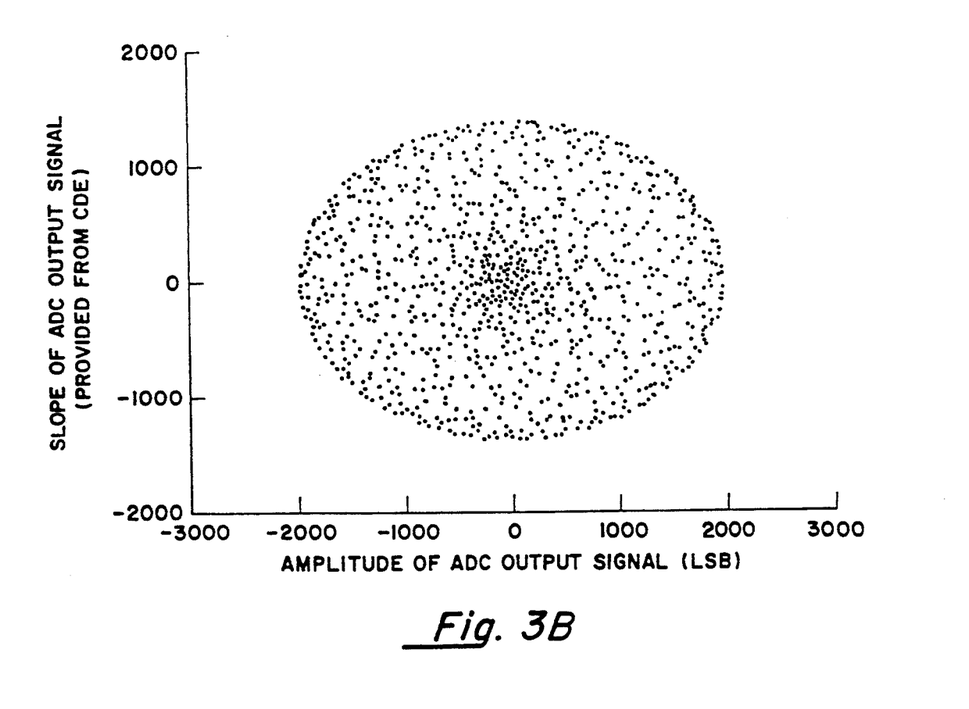

Referring now to FIG. 3B, FIG. 3B shows the location of compensation values stored in a compensation memory having compensation values provided by the calibration algorithm of FIG. 2A. The calibration signal is provided from two sinusoidal signals having frequencies separated by an odd number of frequency bins. Here the first pair of sinusoidal signals are separated by 5 frequency bins and the second pair of sinusoidal signals are separated by 11 frequency bins.

Figure 3C:
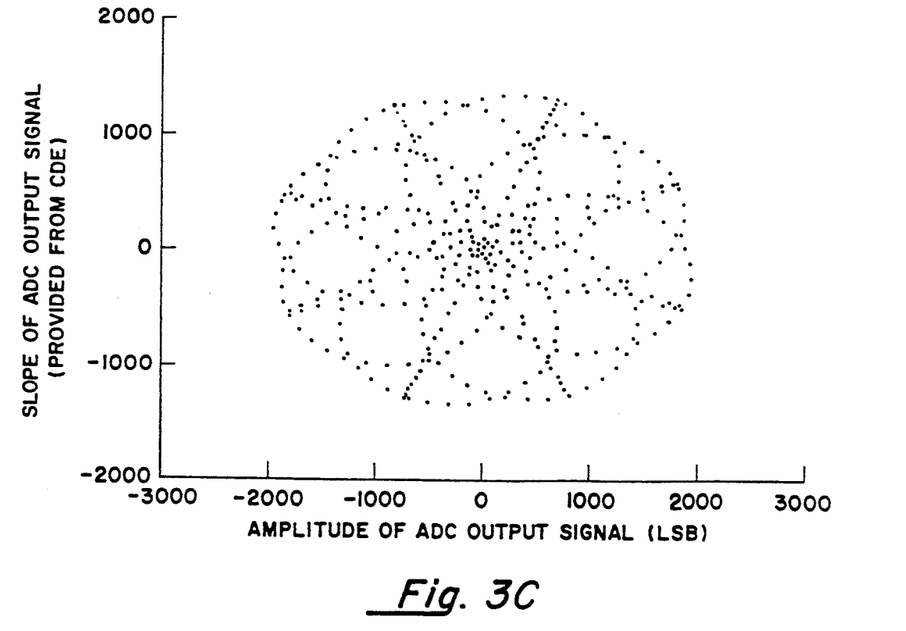

FIG. 3C also shows the location of compensation values stored in a compensation memory provided by the calibration algorithm of FIG. 2A. However, the calibration signal is here provided from two sinusoidal signals having frequencies separated by an even number of frequency bins. Here, the first pair of signals are separated by 2 frequency bins and the second pair of sinusoidal signals are separated by 8 frequency bins.

Figure 4A:
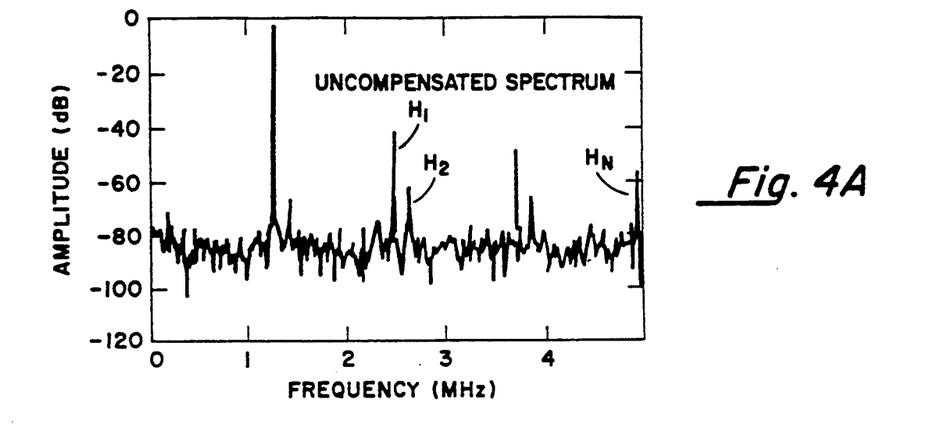
FIGS. 4A-4C are plots of amplitudes versus frequency showing a frequency spectrum of an uncompensated signal (FIG. 4A) and compensated signals (FIGS. 4B and 4C)
Figure 4B:
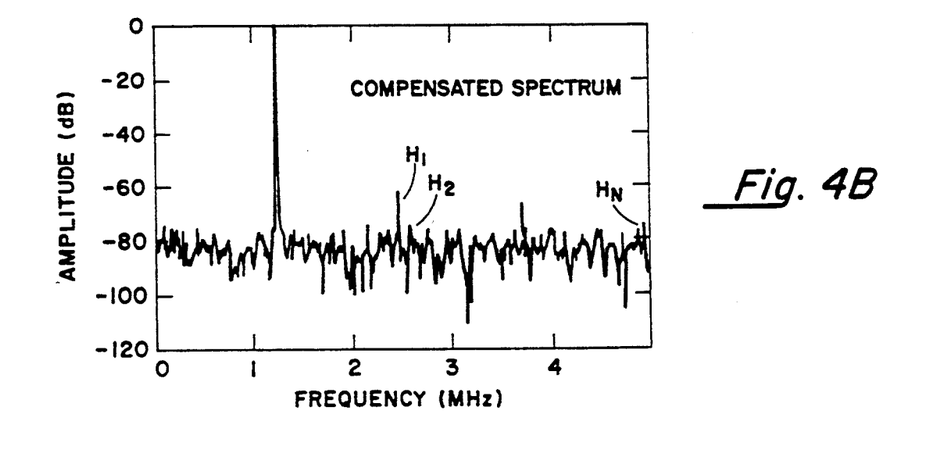
Figure 4C:
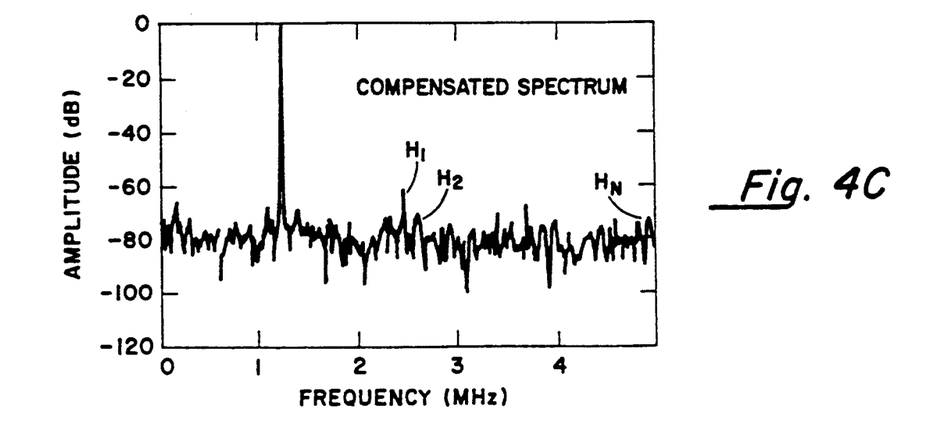

Referring now to FIGS. 4A-4C, FIG. 4A shows a spectral representation of an uncompensated signal provided at the output port of an ADC. FIG. 4B shows the signal after compensation provided from compensation values stored in the calibration memory of FIG. 3B. Note that the harmonic signals $H_1$-$H_N$ of FIG. 4A are provided having a reduced amplitude level in FIG. 4B. FIG. 4C shows a compensated signal provided from compensation values stored in the calibration memory of FIG. 3C. Note that in each of the FIGS. 5B, 5C the harmonic signals $H_1$-$H_N$ of FIG. 5A are each provided having a reduced amplitude in FIGS. 5B, 5C.

Figure 5A:
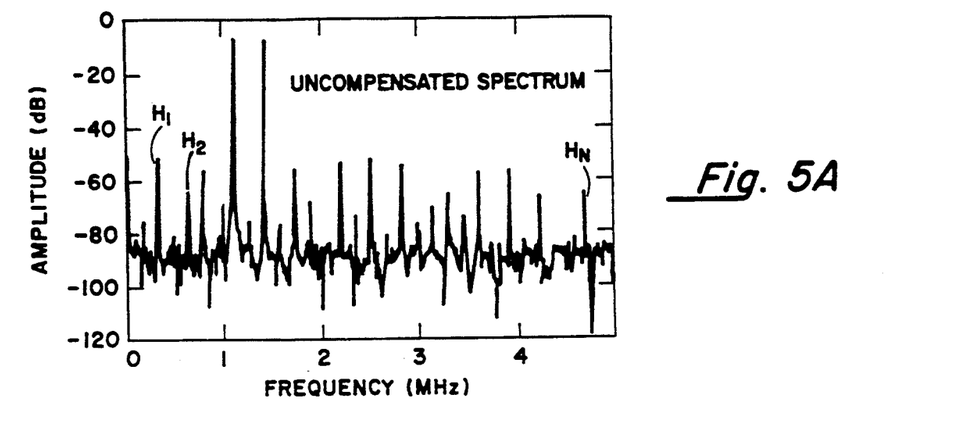
FIGS. 5A-5C are plots of amplitudes versus frequency showing a frequency spectrum of an uncompensated signal (FIG. 5A) and compensated signals (FIGS. 5B and 5C) for an alternate embodiment of the present invention.
Figure 5B:
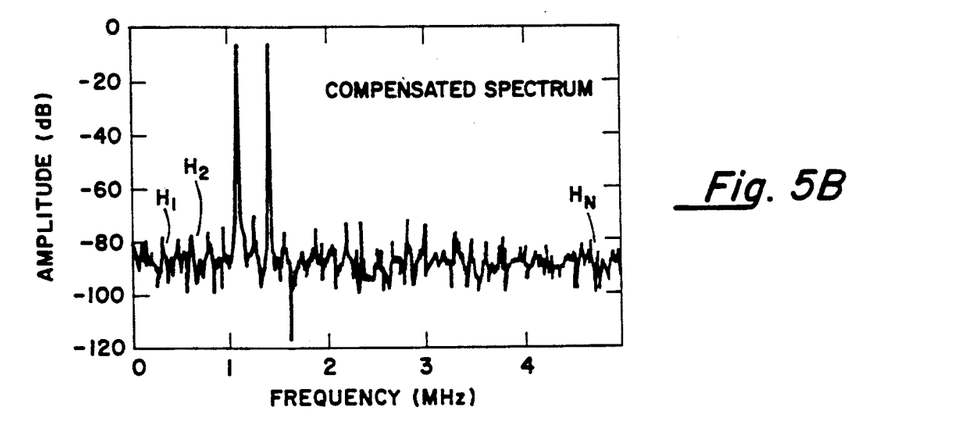
Figure 5C:
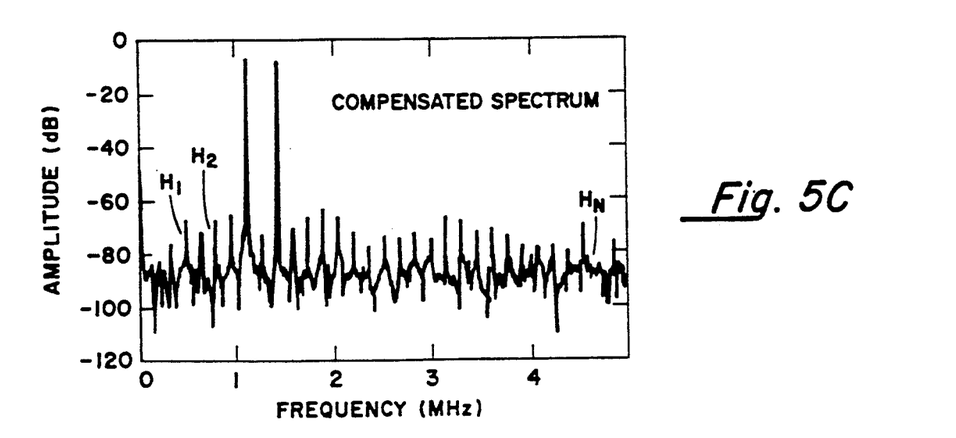

Referring now to FIGS. 5A-5C, FIG. 5A shows a spectral representation of an uncompensated frequency spectrum of a pair of input signals. FIG. 5B shows a compensated frequency spectrum using compensation values provided from the calibration memory of FIG. 3B. FIG. 5C shows a compensated spectrum using the calibration memory of FIG. 3C.

Having described preferred embodiments of the invention, it will now become apparent to one of skill in the art that other embodiments incorporating their concepts may be used. It is felt, therefore, that these embodiment should not be limited to disclosed embodiments, but rather should be limited only by the spirit and scope of the appended claims.

What is claimed is:

1. A calibration circuit comprising:
   a plurality of signal sources each of said signal sources having an output port and providing a signal having a known phase;
   a signal combiner circuit having a plurality of input ports and an output port with each of said input ports being coupled to a corresponding one of said signal source output ports;
   a switch having a common port and at least one branch port, said branch port being coupled to said output port of said signal combiner circuit;
   an analog to digital converter circuit having an input port coupled to the common port and an output port;
   a central processing unit coupled to the output port of said analog to digital converter;
   a summing circuit having a first input port coupled to said central processing unit, a second input port coupled to the output port of said analog to digital converter circuit and an output port; and
   a compensation memory; and
   wherein said central processing unit provides a reference signal represented by a first stream of digital words corresponding to a substantially error free representation of a second stream of digital words provided from said analog to digital converter circuit and wherein said central processing unit computes a difference signal between the first and second streams of digital words and stores the difference signal as a compensation value in said compensation memory; and
   wherein said central processing unit calculates an address of a memory location of said compensation memory in accordance with an amplitude value and a slope value of digital words from said second stream of digital words.

2. The calibration circuit of claim 1 further comprising a phase lock circuit coupled to each of said plurality of signal sources and coupled to the analog to digital converter.

3. The calibration circuit of claim 2 further comprising a memory coupled to said central processing unit and coupled to said summing circuit.

4. The calibration circuit of claim 3 further comprising a noise source coupled to the output ports of the signal combiner circuit.

5. The calibration circuit of claim 4 further comprising:
   an analog receiver having an input port coupled to the common port of said switch and an output port coupled to the input port of said analog to digital converter circuit and an LO signal port; and
   an LO signal source having an output port coupled to the LO signal pair of said analog receiver and said LO signal source being coupled to said phase lock circuit.

6. The calibration circuit of claim 5 further comprising a digital signal processor coupled to the output port of said summing circuit.

7. A method of calibrating an analog to digital converter circuit comprising the steps of:
   simultaneously providing a plurality of analog signals, each of said plurality of analog signals having a different frequency and having a predetermined power level;
   converting said analog signals to a first stream of digital words representative of said plurality of analog signals;
   providing a second stream of digital words indicative of a reference signal representative of a relatively error free representation of said plurality of analog signals;
   computing the difference between said first stream of digital words and a corresponding portion of said second stream of digital words to provide a third stream of digital words indicative of a difference signal; and
   storing the digital words indicative of the difference signal in a memory, wherein the step of storing the digital words indicative of the difference signal in the memory comprises the steps of:
   computing a slope value for each said digital word indicative of the difference signal;
   computing an amplitude value for each said digital word indicative of the difference signal;
   converting said amplitude and slope values to an address of a particular memory location of said memory; and
   storing the digital word indicative of the difference signal in said particular memory location.

8. The method of claim 7 wherein said plurality of analog input signals correspond to a pair of analog signals.

9. The method of claim 8 wherein the step of computing an amplitude value for each said digital word indicative of the difference signal includes the step of computing an average amplitude value for said digitized signal.

10. The method of claim 9 wherein said plurality of analog signals are provided having a frequency separation which corresponds to an odd number of frequency bins in an analog to digital converter circuit.

11. A circuit comprising:
    means for simultaneously providing a plurality of analog signals, each signal having a known phase relationship and each of said signals having a different frequency an having a predetermined power level;
    means, responsive to said simultaneously providing means, for converting said plurality of analog signals to a first stream of digital words indicative of said plurality of analog signals;
    means for providing a second stream of digital words indicative of a reference signal representative of a substantially error free representation of the plurality of analog signals;
    means, responsive to said converting means and to said providing a second stream of digital words means, for computing a third stream of digital words indicative of a difference between the plurality of analog signals and the reference signal;

memory, coupled to the computing means and the converting means; and means, responsive to the computing means and the converting means, for storing the digital words indicative of the difference signal in the memory, wherein the means for storing the digital words indicative of the difference signal in the memory comprises:

means, responsive to the computing means, for computing a slope value for each said digital word indicative of the difference signal;

means, responsive to the computing means, for computing an amplitude value for each said digital word indicative of the difference signal;

means, responsive to the computing means, for converting said amplitude and slope values to an address of a particular memory location of said memory; and means responsive to the computing means, for storing the digital word indicative of the difference signal in said particular memory location.

12. The circuit of claim 11 further comprising:

summing means, having a first input port coupled to said converting means and a second input port coupled to said memory, for providing an output signal indicative of a sum of a stream of digital words form said converting means and the third stream of digital words.

* * * * *